US006804616B2

(12) United States Patent
Bodas

(10) Patent No.: US 6,804,616 B2
(45) Date of Patent: Oct. 12, 2004

(54) METHOD TO ESTIMATE POWER AND COOLING REQUIREMENTS OF SYSTEMS

(75) Inventor: Devadatta V. Bodas, Federal Way, WA (US)

(73) Assignee: Intel Corporation, Santa Clara, CA (US)

(*) Notice: Subject to any disclaimer, the term of this patent is extended or adjusted under 35 U.S.C. 154(b) by 302 days.

(21) Appl. No.: 10/022,448

(22) Filed: Dec. 13, 2001

(65) Prior Publication Data

US 2003/0115000 A1 Jun. 19, 2003

(51) Int. Cl.$^7$ ................................................. G06F 1/26
(52) U.S. Cl. ................................................. 702/61; 702/62
(58) Field of Search ............................. 702/60–62, 85, 702/86, 189, 199

(56) References Cited

U.S. PATENT DOCUMENTS

| | | | | |
|---|---|---|---|---|
| 5,983,357 | A | * | 11/1999 | Sun ............................ 713/324 |
| 6,301,674 | B1 | * | 10/2001 | Saito et al. ................. 713/340 |
| 6,396,169 | B1 | * | 5/2002 | Voegeli et al. ................ 307/52 |
| 6,504,266 | B1 | * | 1/2003 | Ervin ........................... 307/29 |
| 6,512,682 | B2 | * | 1/2003 | Cohen et al. ............... 363/146 |
| 6,594,771 | B1 | * | 7/2003 | Koerber et al. ............. 713/330 |
| 6,625,736 | B1 | * | 9/2003 | Berthaud et al. ........... 713/300 |
| 2002/0066045 | A1 | * | 5/2002 | Layton et al. .............. 713/300 |
| 2003/0005339 | A1 | * | 1/2003 | Cohen et al. ............... 713/300 |
| 2003/0056125 | A1 | * | 3/2003 | O'Conner et al. .......... 713/300 |

OTHER PUBLICATIONS

McPherson, An Introduction to Electrical Machines and Transformers, 1981, John Wiley & Sons, Inc. ISBN 0–471–05586–7, pp23–28 and 222–224.*

* cited by examiner

Primary Examiner—Marc S. Hoff
Assistant Examiner—Craig Steven Miller
(74) Attorney, Agent, or Firm—Blakely, Sokoloff, Taylor & Zafman LLP

(57) ABSTRACT

A method is described for computing the power consumption of a device. The method comprises (1) determining the number and type of each of a plurality of components comprising a system, (2) determining a component power consumption for each of the plurality of components, and (3) determining a device power consumption by summing the component power consumptions of all of the plurality of components. A rack holds multiple systems, provides power to the systems and cool air to remove thermal energy from the systems. Power and cooling requirements for a rack are determined by (1) determining the number and type of components comprising each of the plurality of systems, (2) determining component power consumption for each of the plurality of components, (3) determining a system power consumption for each system by summing the component power consumptions of all components in each system, and (4) determining a rack power consumption by summing the system power consumptions for all systems. Other embodiments are described and claimed.

12 Claims, 8 Drawing Sheets

| COMPONENT | ACTUAL CONFIG. | MAX CONFIG. | DE-RATING FACTOR | VR EFFICIENCY | POWER RANGE LOWER-UPPER (WATTS) | POWER CONSUMED (WATTS) |
|---|---|---|---|---|---|---|
| PROCESSORS (CPU) | 2 | 4 | 0.8 | 0.85 | 30-60 | $\frac{(4 \times 60 \times 0.8)}{0.85} = 225.9$ |
| MEMORY | 6 | 12 | 0.7 | 0.85 | 5-20 | $\frac{(12 \times 20 \times 0.7)}{0.85} = 197.6$ |
| I/O ADAPTERS | 3 | 8 | 0.5 | 1.0 | 5-20 | $\frac{(8 \times 20 \times 0.5)}{1.0} = 80$ |
| DISK DRIVES | 2 | 5 | 0.8 | 1.0 | 10-20 | $\frac{(5 \times 20 \times 0.8)}{1.0} = 50$ |
| | | | | | $P_{MAX} \rightarrow$ | 553.5W |

| Component | Quantity | Power (Watts) | De-rating Factor | VR Efficiency | Subtotal |
|---|---|---|---|---|---|
| 1 | $q_1$ | $p_1$ | $D_1$ | $E_1$ | $q_1(\frac{p_1 D_1}{E_1})$ |
| ⋮ | ⋮ | ⋮ | ⋮ | ⋮ | ⋮ |
| j | $q_j$ | $p_j$ | $D_j$ | $E_j$ | $q_j(\frac{p_j D_j}{E_j})$ |
| ⋮ | ⋮ | ⋮ | ⋮ | ⋮ | ⋮ |
| J | $q_J$ | $p_J$ | $D_J$ | $E_J$ | $q_J(\frac{p_J D_J}{E_J})$ |

$$P_{CONFIG} \rightarrow \sum_{j=1}^{J} q_j \left(\frac{p_j D_j}{E_j}\right)$$

Figure 3A

| Component | Quantity | Power (Watts) | De-rating Factor | VR Efficiency | Subtotal (Watts) |
|---|---|---|---|---|---|
| Processors | 2 | 40 | 0.8 | 0.85 | 75.3 |
| Memory | 6 | 10 | 0.7 | 0.85 | 49.4 |
| I/O | 3 | 10 | 0.5 | 1.0 | 15 |
| Disk | 2 | 15 | 0.8 | 1.0 | 24 |

$P_{CONFIG} \rightarrow$ 163.7W

Figure 3B

| Component | Quantity | Power (Watts) | De-rating Factor | VR Efficiency | Subtotal (Watts) |
|---|---|---|---|---|---|
| 1 | $q_1$ | $p_1$ | $D_1$ | $E_1$ | $q_1(\frac{p_1 D_1}{E_1})$ |
| ⋮ | ⋮ | ⋮ | ⋮ | ⋮ | ⋮ |
| j | $q_j$ | $p_j$ | $D_j$ | $E_j$ | $q_j(\frac{p_j D_j}{E_j})$ |
| j+1 | $q_{j+1}$ | $P_{(MAX)j+1}$ | $D_{j+1}$ | $E_{j+1}$ | $q_{j+1}(\frac{P_{(MAX)j+1} D_{j+1}}{E_{j+1}})$ |
| ⋮ | ⋮ | ⋮ | ⋮ | ⋮ | ⋮ |
| J | $q_J$ | $P_{(MAX)J}$ | $D_J$ | $E_J$ | $q_J(\frac{P_{(MAX)J} D_J}{E_J})$ |

$$P_{CONFIG} \rightarrow \sum_{j=1}^{j} q_j(\frac{p_j D_j}{E_j}) + \sum_{j=j+1}^{J} q_j(\frac{P_{(MAX)j} D_j}{E_j})$$

Figure 4A

| Component | Quantity | Power (Watts) | De-rating Factor | VR Efficiency | Subtotal (Watts) |
|---|---|---|---|---|---|
| CPU | 2 | 40 | 0.8 | 0.85 | 75.3 |
| Memory | 6 | 20 | 0.7 | 0.85 | 98.8 |
| I/O | 3 | 20 | 0.5 | 1.0 | 30 |
| Disk | 2 | 20 | 0.8 | 1.0 | 32 |

$P_{CONFIG}$ → 236.1W

Figure 4B

| Component | Quantity | Power (Watts) | De-rating Factor | VR Efficiency | Subtotal (Watts) |
|---|---|---|---|---|---|
| 1 | $q_1$ | $p_1$ | $D_1$ | $E_1$ | $q_1(\frac{p_1 D_1}{E_1})$ |
| ⋮ | ⋮ | ⋮ | ⋮ | ⋮ | ⋮ |
| j | $q_j$ | $p_j$ | $D_j$ | $E_j$ | $q_j(\frac{p_j D_j}{E_j})$ |
| ⋮ | ⋮ | ⋮ | ⋮ | ⋮ | ⋮ |
| J | $q_J$ | $p_J$ | $D_J$ | $E_J$ | $q_J(\frac{p_J D_J}{E_J})$ |

$$P_{CONFIG} \rightarrow \beta\left[\sum_{j=1}^{J} q_j(\frac{p_j D_j}{E_j})\right]$$

Figure 5A

| Component | Quantity | Power (Watts) | De-rating Factor | VR Efficiency | Subtotal (Watts) |
|---|---|---|---|---|---|
| CPU | 2 | 40 | 0.8 | 0.85 | 75.3 |
| Memory | 6 | 10 | 0.7 | 0.85 | 49.4 |
| I/O | 3 | 10 | 0.5 | 1.0 | 15 |
| Disk | 2 | 15 | 0.8 | 1.0 | 24 |

Note: $\beta = 1.1$           $P_{CONFIG} \rightarrow$  180.1W

Figure 5B

METHOD TO ESTIMATE POWER AND COOLING REQUIREMENTS OF SYSTEMS

TECHNICAL FIELD

This disclosure relates generally to power consumption of electronic devices, and in particular, but not exclusively, relates to a method of determining the power consumption of a computer system.

BACKGROUND

Data centers are facilities designed to house large amounts of electronic equipment—including devices such as computers, servers and routers—in a central location. Data centers are vital nodes in information superhighway. Data centers are designed to not only provide all the servers, storage systems and networking infrastructure required to support incoming data requests, but to also provide services such as: authentication, security, and RAS (reliability availability serviceability) management. Most often, data centers are large rooms that are closed off and heavily air-conditioned to maintain a suitable operating temperature for the equipment housed there. The rooms typically have racks where the data communication and processing equipment is installed. While there are many benefits to having all the equipment in one place—such as easier access and maintenance—data centers are costly to build and operate. Because of the high cost involved, space in a data center is at a premium, and data center facility managers try to squeeze as much equipment as possible into every data center. To do so, however, data center managers must have an accurate way of assessing the power consumption and cooling requirement of each component housed in the data center. For a data center, power and cooling are closely related, since a large portion of the electrical power consumed by a device usually ends up converted into thermal energy.

A power specification for a computer system, $P_{MAX}$, usually defines maximum power capability of the power supply in the system. In the process of determining a value of $P_{MAX}$, system designers usually consider the worst-case configuration of a system. Thus, $P_{MAX}$ for a system represents power consumption when the system is fully populated with hardware. The determination of $P_{MAX}$ also assumes that the system is configured with the most power hungry components capable of being used in that configuration, and that the system is running software that causes it to consume maximum power. For example, a server system may be designed to support four processors that may run at between 1.5 GHz and 2.2 GHz, 12 slots of memory, 8 slots for input/output (I/O) adapters and 5 bays for hard drives. The $P_{MAX}$ for such a system assumes the system is populated with all four 2.2 GHz (max power) processors, all twelve memory slots, all eight I/O slots populated with power hungry I/O adapters, and the system is using five hard drives.

The present methods for determining $P_{MAX}$ suffer from various disadvantages. First, most systems are populated with less hardware components than their capacity. Second, in the vast majority of cases not all the components used are the most power hungry. For example, many systems may be using processors slower than 2.2 GHz. Slower processors usually consume less power. On average, most of the systems could be consuming power far lower than $P_{MAX}$.

Data center facility managers mistakenly interpret $P_{MAX}$ to be the actual power consumption of the system, rather than the maximum power capability of the power supply. As a result, data center managers currently use $P_{MAX}$ as a guideline to decide the amount of power and cooling they should provide for each rack, and for the data center as a whole. For systems that consume less power that $P_{MAX}$, power delivery and cooling solution based upon $P_{MAX}$ may be over-designed and more expensive than necessary. Moreover, the philosophy of using $P_{MAX}$ generates demand on infrastructure, much higher than what would be actually needed. Data centers that use thousands of such systems, this could result in much large demand and expense on infrastructure.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 3A and 3B are tables illustrating a first embodiment of the invention.

FIGS. 4A and 4B are tables illustrating a second embodiment of the invention.

FIGS. 5A and 5B are tables illustrating a third embodiment of the present invention.

DETAILED DESCRIPTION OF THE ILLUSTRATED EMBODIMENTS

Embodiments of a system and method for computing power consumption for an electronic device such as a computer are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
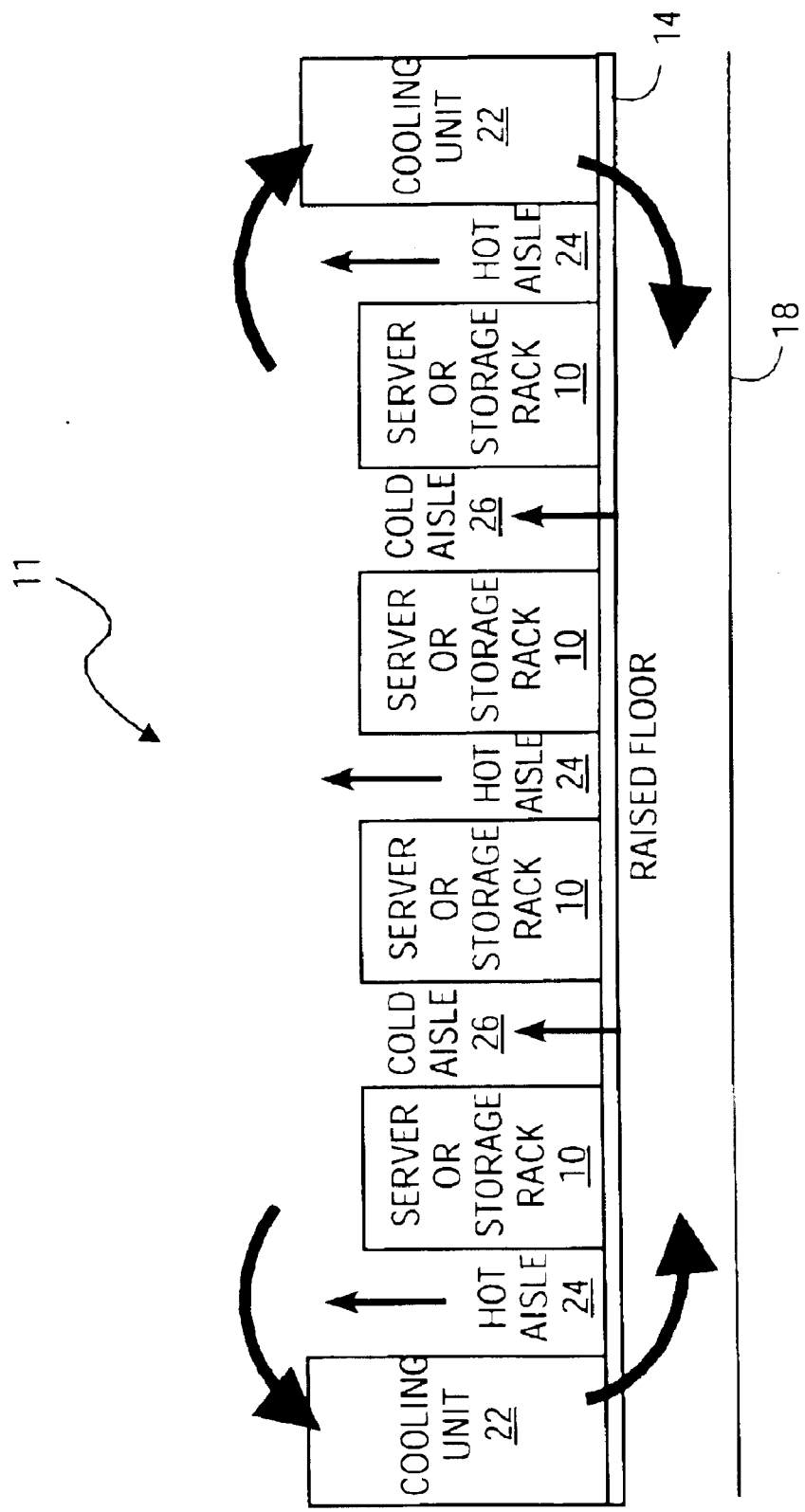
FIG. 1A is an elevation drawing of an arrangement of racks typically found in a data center.

FIG. 1A illustrates one embodiment of an arrangement of a data center 11. The data center 11 includes a plurality of rack assemblies 10 positioned in rows separated from each other by aisles, as well as a plurality of cooling units 22. The racks 10 are supported on a raised floor 14, which is suspended above the actual floor 18 of the data center. In addition to providing space for cables connected to devices in the racks 10, the space between the raised floor 14 and the actual floor 18 provides a path for cooling air to flow from the cooling units 22 to the racks 10. In the data center 11, the aisles between racks alternate between hot aisles 24 and cold aisles 26. In the cold aisles 26, there are gratings or other perforations 20 in the raised floor 14 (see FIG. 1B) surrounding the racks 10, which allows the cool air from underneath the raised floor to flow near the racks and carry away thermal energy generated by components in the racks. Other arrangements of the data center 11 are, of course, possible.

Figure 1B:
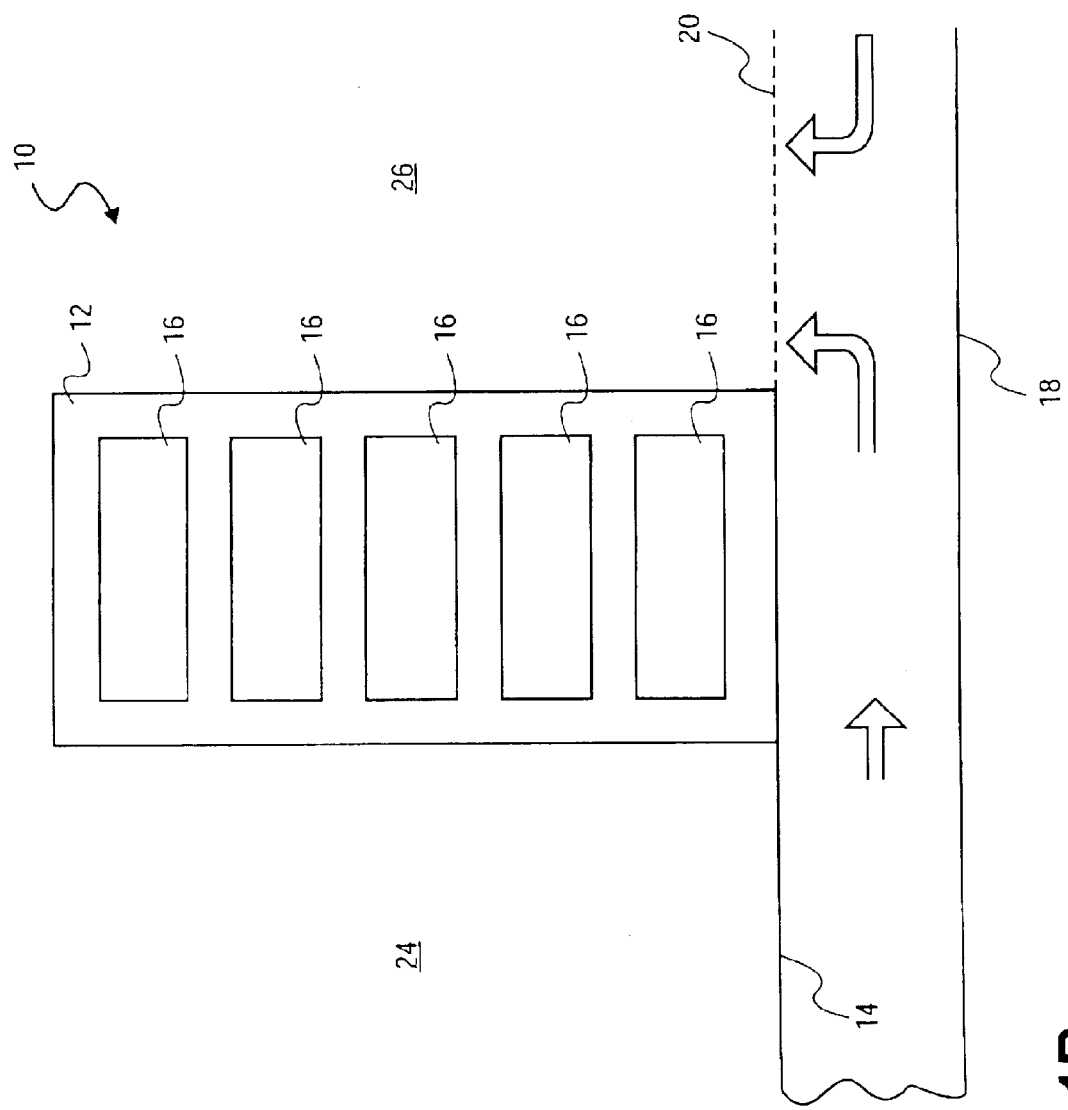
FIG. 1B is an elevation drawing of a typical data center rack and its components.

FIG. 1B illustrates an example of a rack assembly 10 that may be found in some data centers. The rack assembly 10 comprises a rack 12, which usually rests on a raised floor 14. The rack 12 has a plurality of openings 16 into which electronic devices can be inserted; devices typically found in the rack 12 include servers, routers, switches, instruments, and the like. Typically, the raised floor 14 is separated from the actual floor 18 of the data center, and will have a series of perforations or other openings 20 around the rack so that cooling air flowing between the raised floor 14 and the actual floor 18 can flow near the rack and cool the devices in the rack, as shown by the arrows in the figure. Other cooling arrangements are also possible. For example, the rack 10 may not be on a raised floor, and the cold air may be brought near a rack via ventilation ducts.

Each rack 12 has both physical limits and power/cooling limits. The physical limits are relate to the number of openings 16 in the rack; in FIG. 1B, the rack 12 can accommodate five devices, although other racks may be able to accommodate more or less devices. The power/cooling limits relate to the amount of power that can be delivered to the rack, and the amount of cooling air that can be delivered to the rack from underneath the raised floor 14. Power and cooling limits are closely related, since most of the power delivered to the device as electrical energy ends up being converted into thermal energy. For example, the rack 12 may have a physical limit of five devices as shown, while having a maximum power capacity of 2000 W, meaning that the total power consumption of all devices in the rack must be less then or equal to 2000 watts. In some cases, the rack may encounter its power and cooling limits before it encounters its physical limits, meaning that the total power allocation of the rack is used up before its physical space is. This results in wasted space, which is a disadvantage in application such as data center where space is at a premium.

Currently, data center managers put devices into the rack 12 until the physical or power/cooling limits of the rack are reached. With the increasing miniaturization of electronics, it is more common to reach the power/cooling limit before reaching the physical limit. To determine the power consumption of each device being put into the rack, the data center manager usually looks at the size of the power supply built into the particular device. The power supplies are usually sized to accommodate the maximum power $P_{MAX}$ that the particular device could possibly use. The data center manager then puts devices into the rack 12 until the sum of the capacities of the power supplies of the devices reaches the power and cooling capacity of the rack.

Figures 2A, 2B:
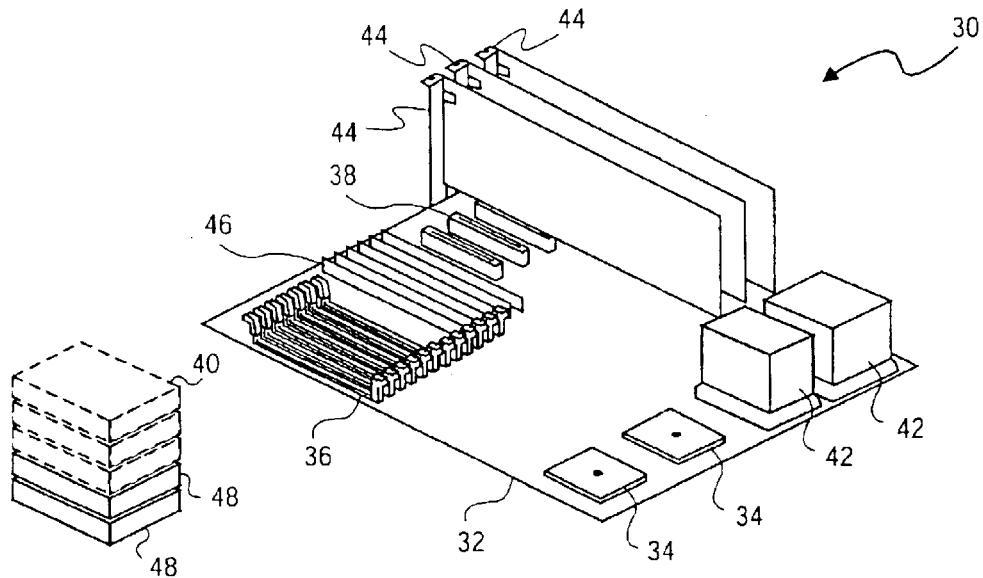
FIG. 2A is a perspective view of a typical computer configuration.
FIG. 2B is a table illustrating the determination of maximum power for the computer configuration illustrated in FIG. 2A.

FIG. 2A illustrates one possible embodiment of the internal configuration of a computer 30, which is one type of device commonly found in racks at data centers. The computer 30 includes a motherboard 32 having a number of slots thereon, so that the elements that comprise a computer can be attached to the motherboard. The motherboard 32 includes four processor sockets 34 to which microprocessors can be attached, twelve memory slots 36 into which memory (e.g., DIMM modules) can be inserted, and eight input/output (I/O) adapters 38 for receiving a variety of components, such as I/O controllers, sound cards, and the like. Additionally, the motherboard 32 can support as many as five hard drives 48, which would be housed in five hard drive slots 40 found in the system chassis.

FIG. 2B illustrates the determination of $P_{MAX}$ for the computer 30 shown in FIG. 2A. As shown, $P_{MAX}$ is determined by assuming that the motherboard is fully populated with components, and that each component was the most power-hungry component of its type. The vast majority of computers do not, however, have a fully populated motherboard; instead, only selected components are usually present. In FIG. 2A, the motherboard has sockets 34 for four processors, but only two processors 42 are present. Likewise, the motherboard has space for eight I/O adapters, but only three I/O adapters 44 are present; it has space for twelve memory modules, but only six modules 46 are present; and it can support as many as five hard drives, but only two hard drives 48 are presently connected to the motherboard and housed in the drive slots 40 of the system chassis. Moreover, the actual configuration often does not include the most power-hungry components. Thus, in most cases, the calculated power consumption $P_{MAX}$ of the computer far exceeds its actual power consumption because of the assumed presence of components that are not there.

FIGS. 3A and 3B together illustrate a first embodiment of the present invention. FIG. 3A illustrates the embodiment in general terms, while FIG. 3B provides a prophetic example for a case where the device is a computer. FIG. 3A tabulates the elements of a device that includes J different types of components. For each component j (j=1 to J), FIG. 3A lists the quantity $q_j$ of that particular component found in the device, the power consumption $p_j$ of each component, a de-rating factor $D_j$ and a voltage regulator (VR) efficiency $E_j$. For each component j, the power $p_j$ is the actual power consumption of the component, rather than the power consumption of the most power-hungry version of that component. Some system components may use a voltage regulator, VR, that steps down voltage provided by a system power supply to a voltage that is acceptable to the component. The de-rating factor $D_j$ attempts to account for less than full-time use of each component, while the VR efficiency $E_j$ accounts for the efficiency of the voltage regulator, if present. The de-rating factor $D_j$ and efficiency $E_j$ generally have values between 0 and 1, including 0 and 1. The de-rating factor is a subjective number usually chosen by the power system designer based on his or her experience, and possibly some other empirical factors. It is not an analytically determinable number, nor will it be the same for every power system design.

The first step in computing the power consumption of the device described in FIG. 3A is to compute the power consumption of each component j. To do so, for each component j the power $p_j$ is multiplied by the de-rating factor $D_j$, and this quantity is then divided by the VR efficiency $E_j$. The resulting quantity is then multiplied by the actual quantity $q_j$ of that particular component found in the device. This operation is carried out for each component in the device, and then the resulting quantities are summed to obtain the total power consumption $P_{CONFIG}$ of the configuration as follows:

$$P_{CONFIG} = \sum_{j=1}^{J} q_j \left( \frac{p_j D_j}{E_j} \right)$$

This formulation of $P_{CONFIG}$ defines the power consumed by the system as it is configured, rather than the power $P_{MAX}$ consumed in the worst-case scenario. $P_{MAX}$ indicates what system is capable of when populated with power hungry hardware running power hungry software. But using $P_{MAX}$ creates excess demand for power and cooling infrastructure, and thus results in less usable space in rack at data centers, higher demand for power and higher cost. Since $P_{CONFIG}$ represents actual power that can be consumed by systems, this will help user more accurately allocate and budget more realistic number for the infrastructure. In most cases $P_{CONFIG}$ will be lower that $P_{MAX}$, so data center managers can realize substantial savings, both in cost and space, by using $P_{CONFIG}$ instead of $P_{MAX}$.

FIG. 3B illustrates a prophetic example of the embodiment illustrated in FIG. 3A, using as an example the computer described in FIGS. 2A and 2B. This example assumes that the component actually chosen for use in the computer would have power consumptions in the middle of the ranges shown in FIG. 2B. Applying the embodiment described in FIG. 3A, power consumption for the given configuration, $P_{CONFIG}$ turns out to be 163.7W. This is substantially less than the 553.5W which would result if the maximum of each configuration were used as shown in FIG. 2A. This lower and more accurate power consumption translates directly into savings in power and cooling for data centers.

FIGS. 4A and 4B together show a second embodiment of the present invention. The approach of this embodiment differs slightly from the approach of the first embodiment. In this embodiment, the actual power consumption of the component is used for components whose power consumption exceeds a certain threshold power, whereas the power consumption of the most power-hungry component is used for those components whose power consumption falls below the threshold power. For instance, in a computer configured to use 4 I/O cards and a processor between 1 GHz and 3 GHz, this approach would use the actual power consumption of the processor in the system (which tends to consume significant power), while using the power consumption of the most power-hungry I/O cards (which tend to consume less significant power).

FIG. 4A illustrates this embodiment in general terms, while FIG. 4B provides a prophetic example for case where the device is a computer. FIG. 4A tabulates the elements of a device with J components. For each component j (j=1 to J), the table lists a quantity $q_j$, which is the number of that component found in the device, as well as a de-rating factor $D_j$, and a VR efficiency $E_j$. For ease of illustration the components have been segregated, such that for components from 1 to j, the actual power consumption $p_j$ is used. For components j+1 through J, the maximum power $p_{(max)j}$ is used. Thus, in this embodiment, in contrast to the previous embodiment, the total power consumption is computed using the actual power consumption of some components, while using the maximum power consumption for other components. Usually, the maximum power consumption will be employed for components that have lower relative power consumption, such as I/O adapters.

To determine the overall power consumption of the device, the power consumption for each component (whether it be the actual power or the maximum power) is multiplied by the de-rating factor $D_j$, and the resulting number is divided by the efficiency $E_j$. The resulting quantity is then multiplied by $q_j$ to account for the number of any given component. As before, once the power consumption for each given type of component found in the configuration is computed, the overall power consumption of the configuration, $P_{CONFIG}$, is computed as follows:

$$P_{CONFIG} = \sum_{j=1}^{j} q_j \left( \frac{p_j D_j}{E_j} \right) + \sum_{j=j+1}^{J} q_j \left( \frac{p_{(MAX)j} D_j}{E_j} \right)$$

This formulation of $P_{CONFIG}$ does not define the power consumed by the system exactly as configured, but still provides a more accurate approximation than the power $P_{MAX}$ consumed in the worst-case scenario. Since $P_{CONFIG}$ determined this way is closer to the actual power that can be consumed by systems, this will help user more accurately allocate and budget more realistic number for the infrastructure. In most cases this $P_{CONFIG}$ will still be lower that $P_{MAX}$, so data center managers can realize substantial savings, both in cost and space, by using this $P_{CONFIG}$ instead of $P_{MAX}$.

FIG. 4B provides a prophetic example of this embodiment using the configuration of the computer described in FIGS. 2A and 2B. This example assumes that the component actually chosen for use in the computer would have power consumptions in the middle of the ranges shown in FIG. 2B. The threshold power is set at 40W: for components with power consumption below 40W, the maximum power consumption is used, while for components with a power consumption at or above 40W, the actual consumption is used. Applying the embodiment described in FIG. 4A, power consumption for the given configuration, $P_{CONFIG}$ turns out to be 236.1W. This is substantially less than the 553.5W which would result if the maximum of each configuration were used as shown in FIG. 2A. This lower and more accurate power consumption translates directly into savings in power and cooling for data centers.

FIGS. 5A and 5B together show a third embodiment of the present invention. The approach of this third embodiment is identical to the approach of the first embodiment, except that the overall power consumption is multiplied by a "safety margin factor" β which, like the de-rating factor $D_j$ and efficiency $E_j$, will usually be a subjective factor applied by a designer, depending on their level of comfort with the computed power consumption.

FIG. 5A illustrates the embodiment in general terms, while FIG. 5B provides a prophetic example for case where the device is a computer. FIG. 5A describes the device with J components. The variables associated with each element 1 through J are defined similarly to those in the first embodiment. As in the first embodiment, the first step in computing the power consumption of the device described in FIG. 5A is to compute the power consumption of each component j. To do so, for each component j the power $p_j$ is multiplied by the de-rating factor $D_j$, and this quantity is then divided by the VR efficiency $E_j$. The resulting quantity is then multiplied by the actual quantity $q_j$ of that particular component found in the device. This operation is carried out for each component in the device, and then the resulting quantities are summed to obtain the total power consumption of the configuration. $P_{CONFIG}$ for the configuration is then determined by multiplying the power consumption by a safety margin factor β as follows:

$$P_{CONFIG} = \beta \left[ \sum_{j=1}^{J} q_j \left( \frac{p_j D_j}{E_j} \right) \right]$$

As with the second embodiment described above, this formulation of $P_{CONFIG}$ does not define the power consumed by the system exactly as it is configured. It does, however, provide a more accurate approximation than the power $P_{MAX}$ consumed in the worst-case scenario. Since $P_{CONFIG}$ determined this way is closer to the actual power that can be consumed by systems, this will help user more accurately allocate and budget more realistic number for the infrastructure. In most cases this $P_{CONFIG}$ will still be lower that $P_{MAX}$, so data center managers can realize substantial savings, both in cost and space, by using this $P_{CONFIG}$ instead of $P_{MAX}$.

FIG. 5B provides an example of the embodiment shown in FIG. 5A using the computer configuration described in FIGS. 2A and 2B. This example assumes that the component actually chosen for use in the computer would have power consumptions in the middle of the ranges shown in FIG. 2B, and that the safety margin factor β has a value of 1.1. Applying the embodiment described in FIG. 5A, power consumption for the given configuration, $P_{CONFIG}$ turns out to be 180.1W. This is substantially less than the 553.5 W which would result if the maximum of each configuration were used, as shown in FIG. 2A. This lower and more accurate power consumption translates directly into savings in power and cooling for data centers.

Figure 6A:
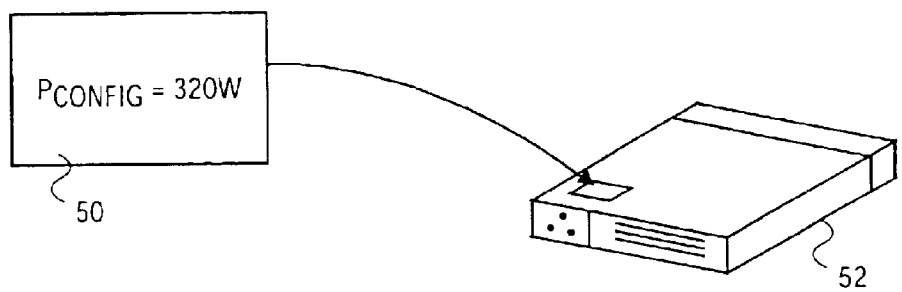
FIGS. 6A–6C are drawings illustrating various methods of implementing the present invention.
Figure 6B:
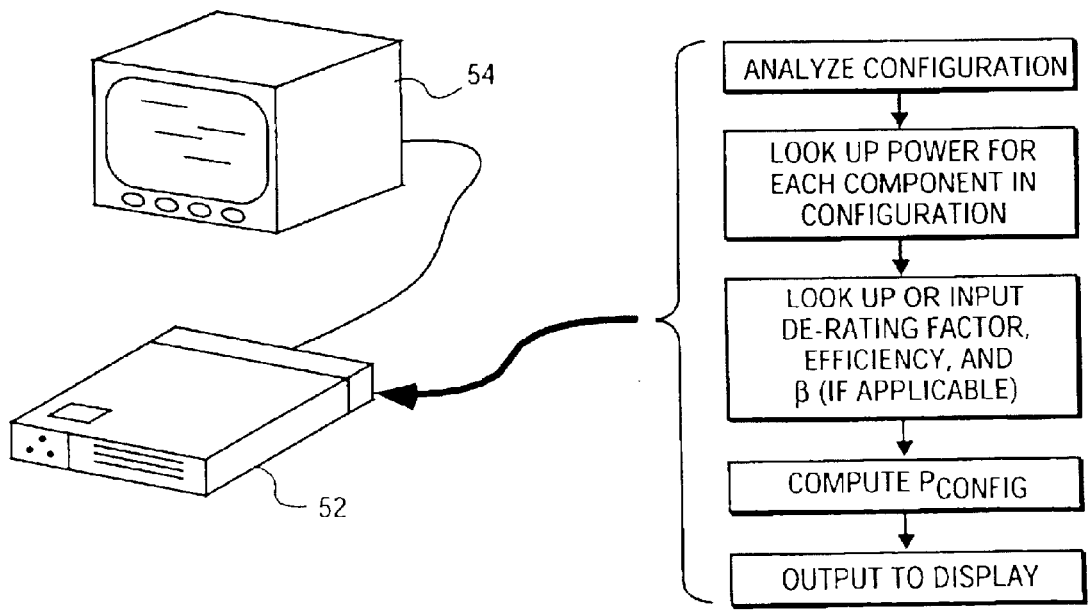
Figure 6C:
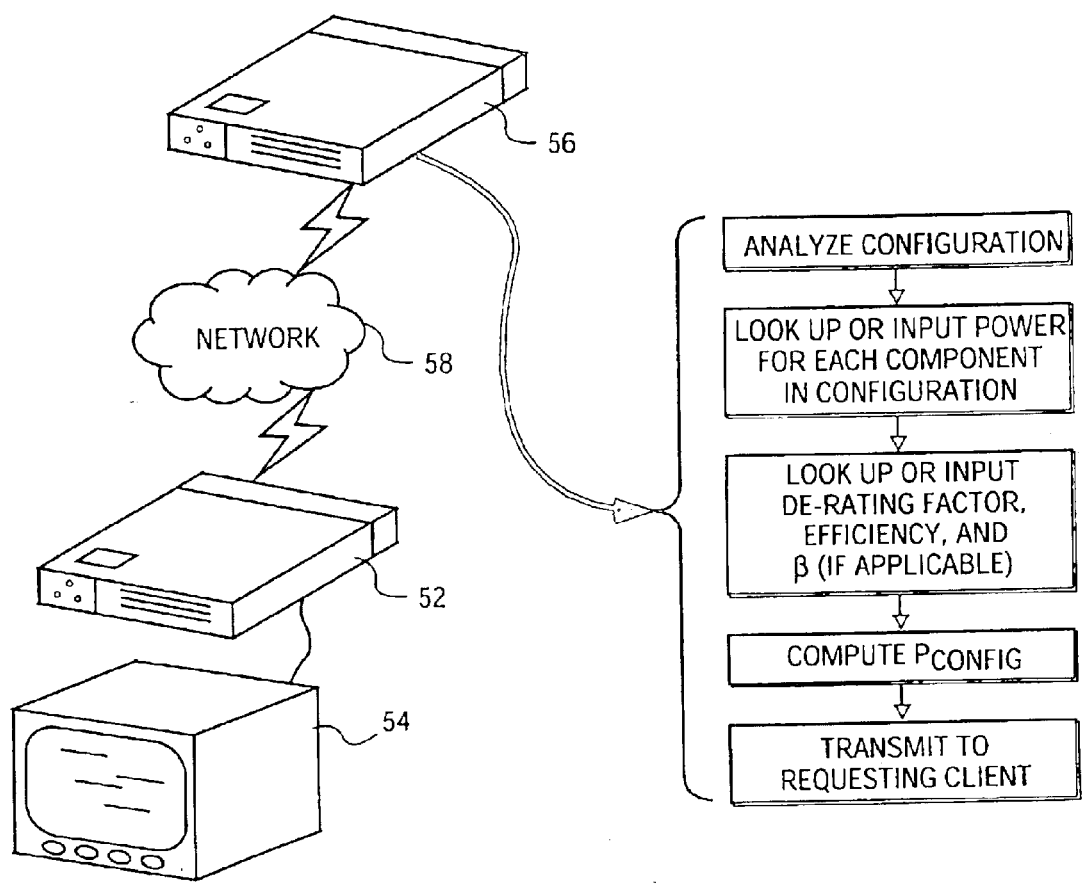

FIGS. 6A–6C illustrate ways in which $P_{CONFIG}$ can be communicated to, and implemented by, data center managers. The benefits of determining a more accurate power consumption using one of the above embodiments will not be realized unless the actual power consumption is communicated to the data center facility manager, so that they can take the actual power consumption into account when they place devices in a rack, and decide how many racks can fit in a data center. FIG. 6A illustrates one embodiment in which the actual power consumption of the configuration ($P_{CONFIG}$) can be computed, printed on a label 50, and the label can be put on the outside of the cabinet 52 of the device at the time of manufacture. That way, once the data center facility managers get the device, they know the power consumption immediately from the label.

FIG. 6B illustrates another embodiment in which the embodiments of $P_{CONFIG}$ described above could be implemented in software resident on the device itself. Thus, for example, the computer 52 could have software thereon that would analyze the system, determine the exact configuration, and then use that information to compute the actual power consumption of that particular configuration. The result would be transmitted to a display 54 for the data center facility manager to see.

FIG. 6C shows yet another possible embodiment in which the software to compute the power consumption of the configuration could be put on a website resident on a server 56. The web site would be accessed by a facility manager via a network 58 (e.g., the Internet). The facility manager would input quantity and type of some or components to the web site, which would then analyze the configuration, compute $P_{CONFIG}$, and return the value on the website or to the computer 52 via the network 58. The computer 52 would then display the value on the display unit 54. Computer manufacturers often consider information on de-rating factors and VR efficiencies to be proprietary and confidential. One advantage of the web site approach would be that it allows a manufacturer to provide accurate power consumptions to its customers while maintaining the confidentiality of the manufacturer's information.

In another possible embodiment, the embodiments of FIGS. 6B and 6C could be combined, such that there would be a piece of software resident on the computer itself which would analyze and determine the number and type of components in the computer 52, and then automatically contact the website 56, to which it would send the information regarding the configuration. The website would then return a number that represents the actual configuration power consumption.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A process comprising:
   determining the number and type of each of a plurality of components comprising a device;
   determining a component power consumption for each of the plurality of components, wherein the component power consumption comprises an actual power consumption for those components whose actual power consumption exceeds a threshold power, and a maximum power consumption for those components whose actual power consumption does not exceed the threshold power; and
   determining a device power consumption by summing the component power consumptions of all of the plurality of components.

2. The process of claim 1, further comprising communicating the device power consumption to an end user.

3. The process of claim 2 wherein communicating the device power consumption comprises printing the device power consumption on a label and attaching the label to the device.

4. The process of claim 2 wherein communicating the device power consumption comprises including with the device software that determines the device configuration and the device power consumption.

5. The process of claim 2 wherein communicating the device power consumption comprises furnishing a web site where the end user can compute the power consumption.

6. An article of manufacture, comprising:
   a machine-readable medium having instructions stored thereon to:
   determine the number and type of each of a plurality of components comprising a device;
   determine a component power consumption for each of the plurality of components, wherein the instructions to determine the component power consumption comprise instructions to determine an actual power consumption for those components whose actual power consumption exceeds a threshold power, and a maximum power consumption for those components whose actual power consumption does not exceed the threshold power; and determine a device power consumption by summing the component power consumptions of all of the plurality of components.

7. The article of manufacture of claim 6, further comprising instructions to communicate the device power consumption to an end user.

8. The article of manufacture of claim 7 wherein the instructions to communicate the device power consumption comprise instructions to print the device power consumption on a label and attach the label to the device.

9. The article of manufacture of claim 7 wherein the instructions to communicate the device power consumption comprise instructions that allow the device to determine its configuration and power consumption.

10. The article of manufacture of claim 7 wherein the instructions to communicate the device power consumption comprise instructions on a web site that allows the end user to compute the power consumption.

11. A system comprising:

a plurality of devices installed in a rack, wherein each device comprises a plurality of components, wherein the capacities of a power supply and a cooling unit for the rack are determine by:

determining the number and type of each of the plurality of components comprising each of the plurality of devices, determining a component power consumption for each of the plurality of components, wherein the component power consumption comprises an actual power consumption for those components whose actual power consumption exceeds a threshold power, and a maximum power consumption for those components whose actual power consumption does not exceed the threshold power, determining a device power consumption for each device by summing the component power consumptions of all of the plurality of components, and determining a rack power consumption by summing the device power consumptions for all of the plurality of devices.

12. The system of claim 11 further comprising a label attached to the device, wherein the label has the device power consumption printed thereon.

* * * * *